United States Patent
Desko, Jr. et al.

(10) Patent No.: US 7,339,274 B2
(45) Date of Patent: Mar. 4, 2008

(54) METALLIZATION PERFORMANCE IN ELECTRONIC DEVICES

(75) Inventors: John C. Desko, Jr., Wescosville, PA (US); Bailey R. Jones, Mohnton, PA (US); Sean Lian, Allentown, PA (US); Simon John Molloy, Allentown, PA (US); Vivian Ryan, Hampton, NJ (US)

(73) Assignee: Agere Systems Inc., Allentown, PA (US)

( * ) Notice: Subject to any disclaimer, the term of this patent is extended or adjusted under 35 U.S.C. 154(b) by 96 days.

(21) Appl. No.: 10/919,591

(22) Filed: Aug. 17, 2004

(65) Prior Publication Data

US 2006/0038294 A1 Feb. 23, 2006

(51) Int. Cl.
*H01L 21/283* (2006.01)

(52) U.S. Cl. .............. 257/775; 257/767; 257/762; 257/773; 257/776; 257/E21.577

(58) Field of Classification Search ............ 257/767, 257/E21.577, 775, 762, 773, 776
See application file for complete search history.

(56) References Cited

U.S. PATENT DOCUMENTS

| | | | | | |
|---|---|---|---|---|---|
| 5,268,329 | A | * | 12/1993 | Chittipeddi et al. | 438/627 |
| 5,290,731 | A | * | 3/1994 | Sugano et al. | 438/653 |
| 5,358,733 | A | * | 10/1994 | Lur et al. | 438/598 |
| 5,798,301 | A | * | 8/1998 | Lee et al. | 438/653 |
| 5,930,669 | A | * | 7/1999 | Uzoh | 438/627 |
| 6,342,448 | B1 | * | 1/2002 | Lin et al. | 438/687 |
| 6,380,628 | B2 | * | 4/2002 | Miller et al. | 257/762 |
| 6,586,334 | B2 | * | 7/2003 | Jiang | 438/687 |
| 6,614,114 | B2 | * | 9/2003 | Gris | 257/750 |

* cited by examiner

*Primary Examiner*—Eugene Lee

(57) ABSTRACT

Phenomena such as electromigration and stress-induced migration occurring in metal interconnects of devices such as integrated circuits are inhibited by use of underlying non-planarities. Thus the material underlying the interconnect is formed to have non-planarities typically of at least 0.02 μm in height and advantageously within 100 μm of another such non-planarity. Such non-planarities, it is contemplated, reduce grain boundary movement in the overlying interconnect with a concomitant reduction in void aggregation.

27 Claims, 6 Drawing Sheets

METALLIZATION PERFORMANCE IN ELECTRONIC DEVICES

TECHNICAL FIELD

This invention relates to electronic devices employing metals for electrical connection and in particular, electronic devices having metal regions undergoing stress.

BACKGROUND OF THE INVENTION

In electronic devices such as integrated circuits electrical interconnection at least in some portion of the device is made by forming metal conductors such as aluminum or copper conductors. Such conductors, often denominated runners, have relatively small cross sections that depend on one or more design rules that form the basis of the layout and manufacture of the device. For example, for devices having a design rule of 0.5 µm, aluminum runners generally have dimensions in the range 0.5 to 2.0 µm. Similarly in devices having a design rule of 0.13 µm, copper runners are generally employed and have dimensions in the range 0.4 to 12.0 µm. (Design rule in this context is the dimension of a critical component of the device such as the gate width of transistors in MOS integrated circuits.).

Generally in electronic devices the electrical interconnects required to produce desired functions are not producible using one layer of conductive runners. Indeed, in present day devices, up to 12 levels of conductive runners are employed. Each level is separated from an underlying level generally by a dielectric material commonly denominated an interlevel dielectric. For example, in the case of aluminum runners on a silicon wafer typically used in devices having design rules of 0.5 µm or larger, the aluminum runners are formed by blanket deposition of an aluminum layer with subsequent lithography and etching to produce the desired runner pattern. A dielectric material, such as a deposited silicon dioxide, is formed over the patterned runners and openings in the dielectric are made (generally by lithography and etching) where interconnection between layers of runners is needed. The process is repeated to produce further levels of patterned runners.

Typically, metals such as copper, tantalum, titanium, and tungsten, are used for metal runners in devices having design rules of 0.4 µm or less. However, runners such as those made from copper are not formed by blanket deposition of copper with subsequent etching because etching of copper has proven to be difficult. Instead, a dielectric layer is formed and trenches corresponding to the intended copper pattern are introduced by lithography and etching of this dielectric layer. The trenches are then filled, typically by electroplating deposition and then the copper overlying the dielectric is removed by chemical/mechanical polishing (CMP). Because copper rapidly diffuses through dielectrics such as silicon dioxide, the copper runner is typically surrounded by a barrier layer such as tantalum nitride to prevent such diffusion. (See Merchant, S. M., et. al., ECS Proceedings, Interconnect and Contact Metallization for ULSI, 2000, Vol. 99-31, pp. 91-98 for a description of processes suitable for introducing a desired barrier layer.)

Problems of electromigration and stress induced migration have plagued metal runners. (Electromigration is the movement of copper within a runner to form a void induced by the flow of current through the runner while stress migration involves formation of a void induced by relaxation of stress produced by phenomena such as thermal mismatch of materials.)

Electromigration and stress induced migration (collectively referred to, for pedagogic purposes, as migration) has become a growing concern for devices with design rules finer than 0.9 µm due to the relatively high operating temperatures encountered in many present day devices, e.g. temperatures in the range 80 to 110 and sometimes as high as 200° C. These substantially elevated temperatures, together with the temperature cycling produced when a device is turned on and off, enhances the tendency of the metal runners to undergo migration. Indeed, for such thermal cycling, differences in the coefficient of thermal expansion between adjacent materials, e.g. copper runners and interlevel dielectrics, produce relatively large stresses. Additionally, as design rules become finer, the metal runners become correspondingly smaller and thus the surface area of such runners increases relative to their volume also inducing greater stress.

Both copper and aluminum technologies have become relatively standard in the electronic industry, and therefore, changes in the materials employed to produce such devices are not easily made. Accordingly, the mitigation of migration through changes in the materials employed is not particularly desirable. Thus, an approach that reduces migration without changing the materials employed would be quite desirable.

SUMMARY OF THE INVENTION

It has been found that not only is migration a problem for finer design rule (e.g. 0.9 µm or finer) devices using metals such as copper, but also in many present day aluminum based devices migration issues have reappeared. In particular, the previously described difficulties concerning thermal stress related to high operating temperatures and increased current densities even in aluminum devices where migration problems have traditionally been resolved are now matters of concern. An approach has been found to reduce migration irrespective of the metal without resorting to a change in material systems. In particular, the formation of non-planarities in the regions underlying metal runners produces a meaningful reduction in migration. Although an atomistic explanation of the phenomenon is difficult, it is contemplated that these non-planarities pin grain boundaries that form during metal deposition and thus prevent the transport of vacancies due to current flow or stress. Since vacancy transport is inhibited, the aggregation of vacancies to form voids as well as aggregation of smaller voids to produce a void large enough to affect device properties is deterred.

Generally, the desired effect is achieved through non-planarities having a height of at least 0.02 µm as measured in the direction perpendicular to the major surface of the substrate upon which the device is formed. (Height in this context is defined as the largest dimension of the non-planarity in a direction perpendicular to the substrate.) The distance between non-planarities along the length of a runner should generally be no further than 100 µm. (The distance between non-planarities is measured as the shortest distance from the edge of one non-planarity to another. The edge of a non-planarity is defined as the locus of points formed by intersection of the material underlying the metal region and the plane that is the least square fit of the bottom surface of the metal runner where the bottom of a feature is that closest to the substrate on which the device is formed.) Additionally, the non-planarity should generally be within 0.1 µm of the edge of a runner. Since the greatest stresses are produced at the edge of a runner, if the non-planarity deviates from this edge region excessively, the effect on migration is diminished. (The distance of a non-planarity from a runner's edge is the shortest distance measured from the edge of the non-planarity as defined above to the edge of a runner defined as the boundary of outer surface of the runner and the least square fit plane defined above.) By employing non-planarities of suitable dimension, electromigration in metal runners such as copper and aluminum is mitigated.

DETAILED DESCRIPTION

Figure 1:
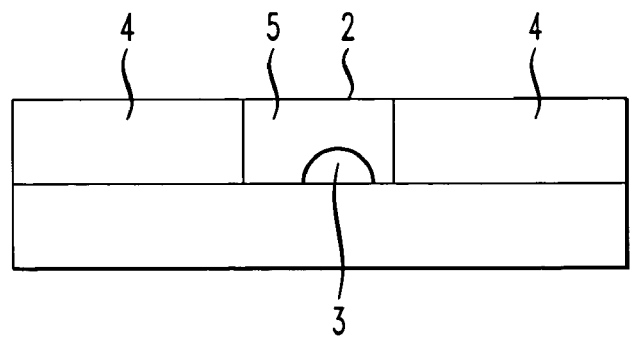
FIGS. 1, 2, 5, 6 and 7 are illustrative of configuration of non-planarities involved in the invention.
Figure 2:
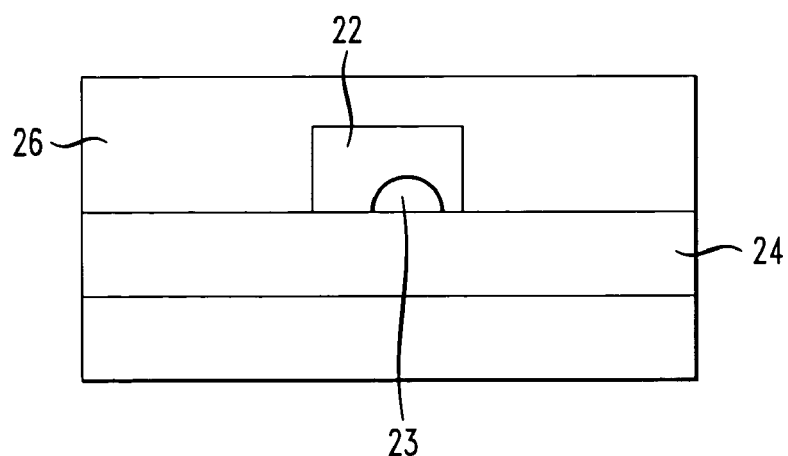

As discussed, migration in metal runners is reduced through the use of non-planarities in the material adjacent to the metal. Thus, as shown in FIG. 1 in cross section, a runner, 2, for example, a copper runner is formed on a non-planarity, 3. As shown in this configuration copper runners are formed in a dielectric, 4, to fill a trench in region 5. Similarly, a metal runner, 22, such as an aluminum runner covered by a dielectric, 26, as shown in FIG. 2, is formed over a non-planarity, 23, in the underlying material, e.g. dielectric material, 24. Methods for forming metal runners in trenches or forming metal runners such as shown in FIG. 2 are well-known and described in, for example Wolf, S. *Silicon Processing for the VLSI Era*, Vol. 2, 1990, Lattice Press, and Paunovic, M. and Schlesinger, M., *Fundamentals of Electrochemical Deposition*, Wiley Interscience, 1998. The underlying material depends on the particular configuration and metal or metals employed. Generally for metals such as copper, underlying barrier materials such as tantalum or tantalum nitride are generally present. In the case of aluminum runners, typical underlying materials are titanium nitride or a silicon oxide. Similarly, for metals such as gold and silver underlying materials such as platinum and titanium/tungsten alloy respectively, are typically employed. The composition of the underlying material is not critical to achieving reduction of migration in accordance with the invention. Thus material changes in processing are not essential.

Figure 3:
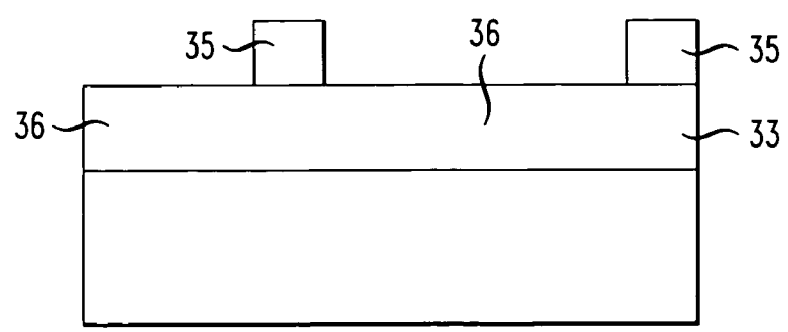
FIGS. 3 and 4 exemplify processes for forming non-planarities.
Figure 4:
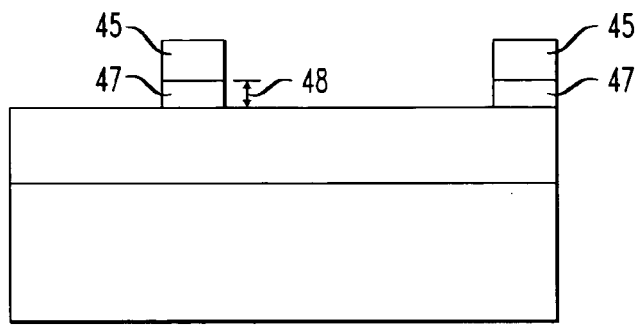

The non-planarities in the material underlying the metal are producible in a variety of ways. For example, as shown in FIG. 3, a layer of the underlying material, 33, is formed and lithographically defined with resist regions 35 that overlay the regions in material 33 to be formed into non-planarities. The exposed regions 36 are then etched to a sufficient depth so that the structure as shown in FIG. 4 is achieved where 45 is the defined resist and the distance 48 corresponds to the depth of etching. (Lithographic and etching processes are conventional and are described for example in Wolf, S., *Silicon Processing for the VLSI Era*, Vol. 1, Lattice Press, 1986.) Alternatively, the non-planarities are producible by ablation techniques such as ion milling. Thus, rather than using lithography, an ion beam is directed to regions such as 36 in FIG. 3 to remove material and yield the non-planarities 47 in FIG. 4. (Ablation techniques such as gallium ion milling are described in Orloff, J., et. al., *High Resolution Focused Ion Beams*, Plenum, 2002.) Feature heights should generally be 0.02 µm or greater. Features with heights less than 0.02 µm typically have reduced salutary effect on migration. Generally, heights greater than 0.3 µm, although not precluded, are inconvenient because of reduction in cross sectional area of the runner. It is contemplated that as the metal is formed on the underlying material small island growth is initiated and continues in a columnar manner. To prevent these columnar grain boundaries from migrating and exacerbating transport of defects that form voids, a non-planarity height of at least twice the diameter of the columnar grains produces the desired pinning of grain boundary migration.

Figure 5:
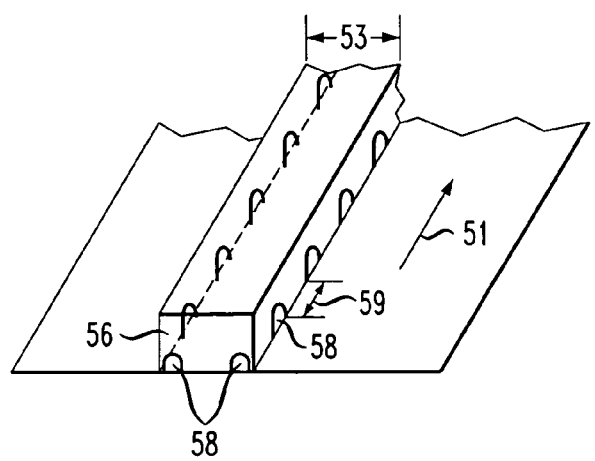

To mitigate undesirable aggregation of voids through migration, the non-planarities typically should be no further than 100 µm apart along the length of the runner i.e. along the transverse edge. Thus as shown in FIG. 5, runner 56 is formed on non-planarities 58. The distance 59 between edges of nearest neighbor non-planarities situated adjacent the edge of a runner should be no greater than 100 µm. It is desirable that non-planarities are present along both edges of a runner provided the width 53 in FIG. 5 is greater than 0.3 µm. For runners whose width is 0.3 µm or less, the non-planarities need only underlie the runner and the distance in the direction 51 of the runner's length should be no greater than 100 µm. Clearly, the presence of some distances greater than about 100 µm between nearest neighbor non-planarities does not preclude improvement in avoiding migration. However, it is generally desirable to limit distances greater than 100 µm to less than 20 percent of the distances between nearest neighbors.

It is also advantageous that the edge of non-planarities be within 0.1 µm of the edge of the overlying runner. Since the greatest stress due to, for example, thermal mismatch occurs at the edge of the metal runner, generally greatest improvement occurs when non-planarities closely approach such regions of augmented stress. Again, not every non-planarity need be within 0.1 µm of the edge of the runner. Generally, it is advantageous that at least 60 percent of these non-planarities should be within such distance. (For this determination non-planarities between two non-planarities that are within 100 µm are not counted.)

Figure 6:
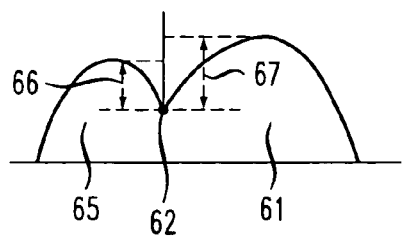
Figure 7:
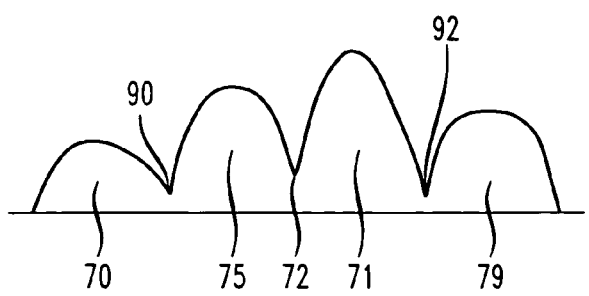

The shape of the non-planarity also has effect on the degree of migration prevention. In particular, if a series of nearest neighbor non-planarities touch as shown in FIG. 6, the height of these non-planarities that are not the outermost of this series is considered for purposes of the invention the distance 66 for non-planarity 65 and the distance 67 for non-planarity 61. As shown in FIG. 6, this height is measured from the highest point on the non-planarity relative to the point of intersection 62 between the two non-planarities. However, for the outermost non-planarities 70 and 79 of a series of touching non-planarities as shown in FIG. 7, the height is as previously described. Additionally, if outermost non-planarities 70 and 79 are within 100 µm as measured from 90 to 92 then the presence of non-planarities 71 and 75 are not essential to the invention and need not be considered. Similarly, if the distance between 90 and 92 is more than 100 µm but the distance between 90 and 72 is within 100 µm, then the presence of non-planarity 75 is not essential and is not considered.

For non-planarities underlying runners formed as described, a substantial improvement in migration prevention is achievable. For example, in copper damascene runners with dimensions 0.44 µm overlying non-planarities in a barrier layer of tantalum nitride essentially no voids of dimension greater than 0.02 µm were observed by scanning electron microscope (SEM) after flowing a current of 1.5 MA/cm$^2$ at temperature of 325° C. for 500 hr.

Electronic devices including at least one non planarity as described above are fabricated as part of a die and are typically interconnected to other components on the die. A plurality of substantially identical dies is typically formed in a repeated pattern on a surface of a wafer. The individual dies are cut or diced from the wafer, then packaged as an integrated circuit. One skilled in the art would know how to dice wafers and package dies to produce integrated circuits. Wafers including at least one die having at least one non planarity as described above are considered part of this invention.

While the invention has been described mostly with respect to processing silicon wafers, the invention is not limited thereto. The invention may be formed using other processing technologies including but not limited to processing technologies to fabricate at least one non planarity as described above on silicon-on-sapphire and in III-V wafers such as gallium arsenide and indium phosphide. The following example is illustrative of conditions suitable for practice of the invention.

EXAMPLE 1

Test structures were formed by fabricating a dummy circuit on a silicon wafer by conventional techniques. Typical LDMOS transistor circuitry was prepared on a 5 inch silicon wafer. A 2000 Å thick silicon oxide film was deposited over the entire wafer by plasma enhanced chemical vapor deposition employing tetraethylorthosilicate as the deposition gas. Parts of the film were lithographically patterned using conventional photoresist lithography techniques such that the film remained only over the polycrystalline silicon regions connecting transistor gates. A 4200 Å polysilicon film was deposited by conventional techniques over the entire wafer. Then a second silicon oxide film was deposited over the entire wafer to a thickness of 1000 Å.

Figure 8:
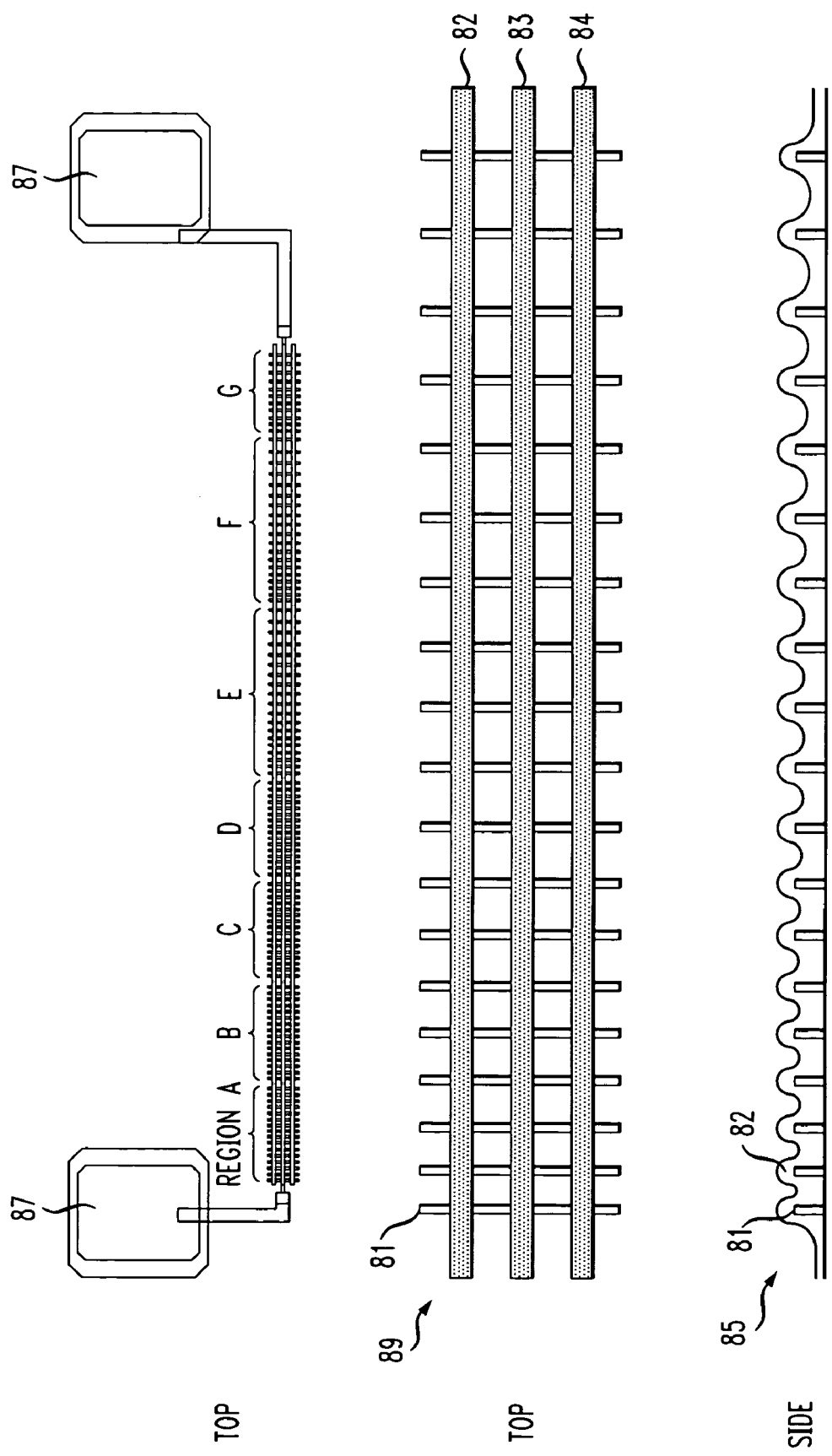
FIGS. 8 through 11 illustrate properties involved in the subject invention.

A region of the sample measuring 88 µm by 1000 µm was employed for producing runners overlying non planarities in accordance with the invention. The non-planarities were formed using conventional lithography. Photoresist was deposited and exposed in a pattern so that regions of the underlying substrate were covered in areas where raised features were desired. Etching was then performed to a depth of 5200 Å into the silicon oxide and polysilicon underlying the photoresist. The 1000 µm dimension of the area to contain these structures was divided into seven regions each region having a raised non-planarity portion in accordance with a logarithmic varying topography shown in FIG. 8. Thus as shown in FIG. 8 seven regions (A through G) of raised non-planarity features, 81 in FIG. 8, are produced with the features in each column having a repeated logarithmic pattern. (One of these regions is shown at 89 as a plan view and in side view at 85.) A 1000 Å sputtered deposition of titanium was followed by a 150 Å sputtered blanket layer of titanium nitride followed by a 1000 Å sputtered deposition of platinum. The three blanket deposited layers were patterned using conventional lithography so that three metallized columns (82, 83, and 84 in FIG. 8) 2 µm in width and 800 µm in length were produced with spaces between metallized lines of approximately 2 µm. A 1.5 µm thick gold layer was then selectively electroplated on top of the platinum of each metallized region. Additionally, by conventional techniques employed for patterning the blanket depositions bonding pads for electrical connections were made in the discrete regions denominated 87 in FIG. 8. These were similarly electroplated with gold in conjunction with the formation of gold regions overlying the metallized columns. The entire structure was then passivated by deposition of a 2500 Å thick layer of dielectric material comprising silicon nitride and a 100 Å thick layer of silicon oxynitride. The structure was annealed at 350° C. for 8 hours.

Figure 9:
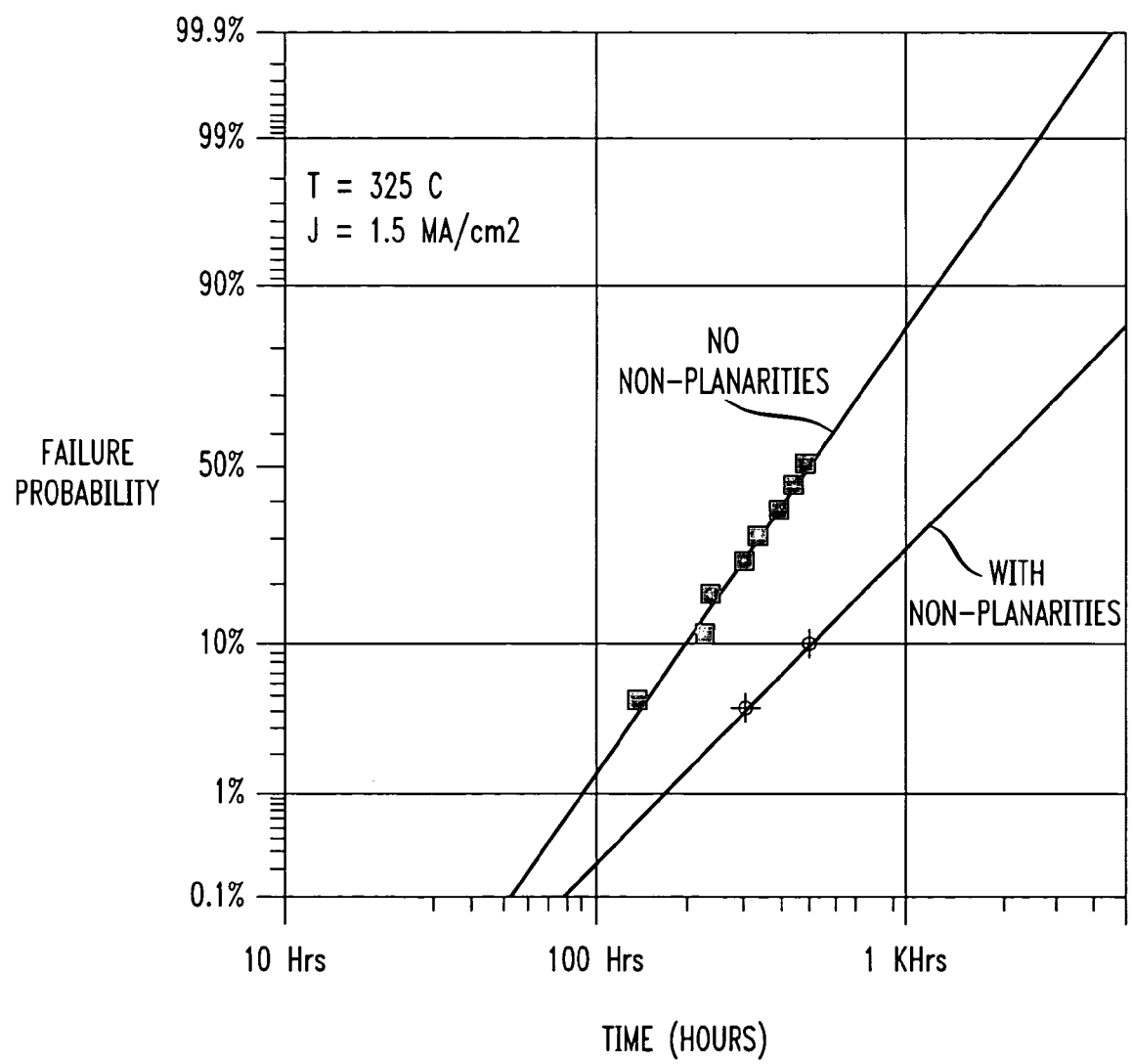

Corresponding test samples were also formed except the metallized layers had a width and height of 1.5 µm and 1.2 µm respectively with spaces between the metallized lines equal to the width of the lines. Similarly, identical test samples were formed except non-planarities were was not etched into the silicon oxide region underlying the metallized lines. A current of 1.5 MA/cm$^2$ was imposed on the center metal line and the voltage drop from one end of this line to the other was monitored. Similarly, the two lines on either side of the center line were monitored for any leakage current resulting from damage to the center line. One hundred percent probability of failure of the center line was considered to have occurred when the resistance of this line as measured by voltage drop increased 20 percent from its initial value. The results obtained for the various samples are shown in FIG. 9. It should be noted that for samples having underlying topography time to failure is significantly extended while no leakage current to adjacent metallized lines was observed.

EXAMPLE 2

Figure 10:
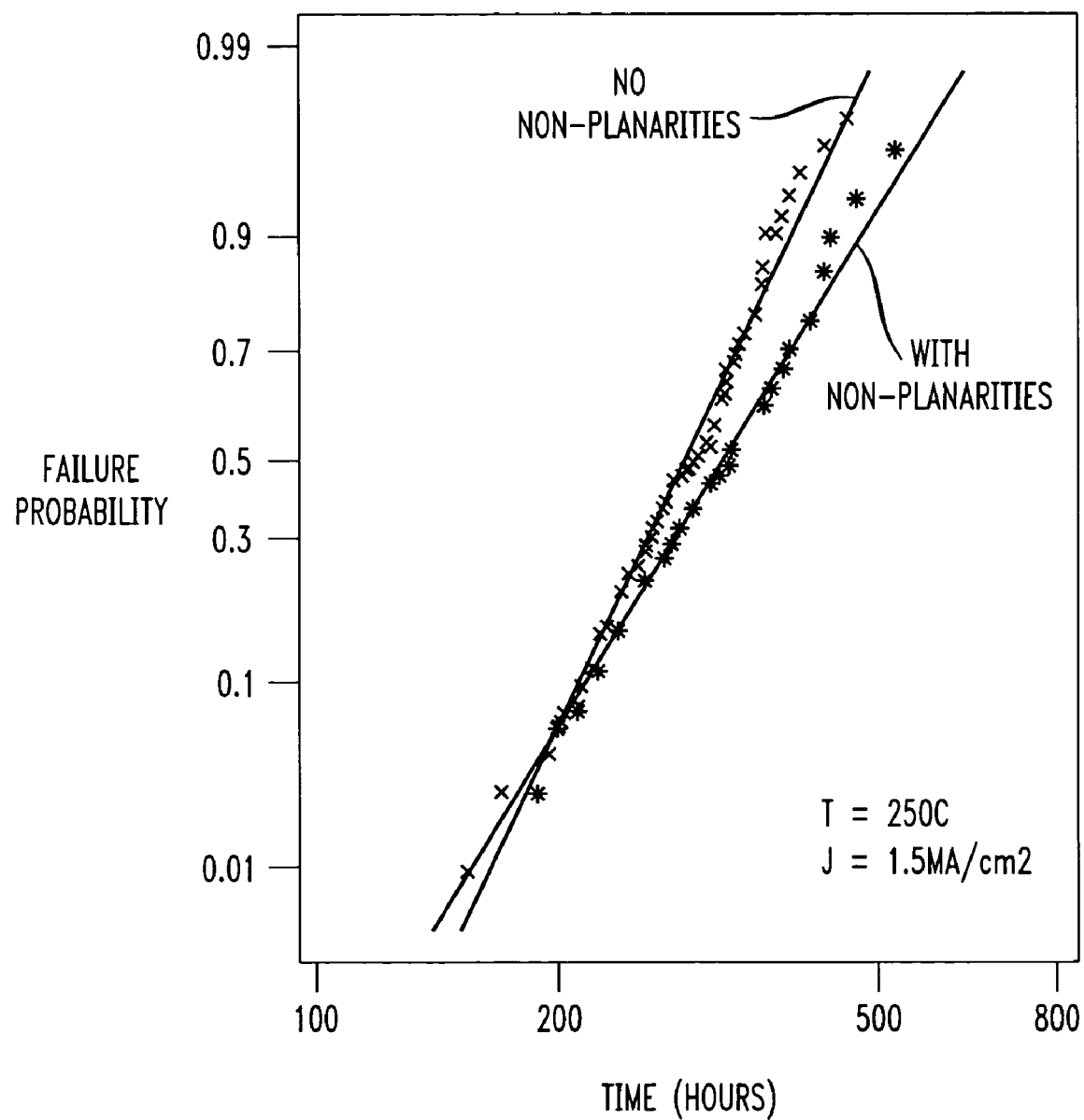

The procedure of Example 1 was followed, except the metallized region constituted 300 Å of titanium, 600 Å of titanium nitride, and 0.45 µm of aluminum that were all sputter deposited. The aluminum lines were 800 µm long, 0.6 µm wide, and with spaces between lines of 0.5 µm. The entire structure was passivated by deposition of a 6000 Å thick layer of a plasma enhanced chemical vapor deposited oxide using tetraethylorthosilicate as the precursor gas and an overlying 4000 Å thick layer of silicon nitride. Final annealing was at 350° C. for 1 hour. Corresponding structures were also formed without the non-planarities underlying the metallized regions. Measurements were made as described in Example 1. The results are shown in FIG. 10.

EXAMPLE 3

The procedure of example 1 was followed, except after formation of non-planarities a silicon dioxide layer having a thickness of 0.26 µm was deposited by plasma enhanced chemical vapor deposition using tetraethylorthosilicate. Trenches in this oxide layer having a width of 0.24 µm were etched above the non-planarities but not into the non-planarities using conventional lithographic and etching techniques. A conformal tantalum nitride layer 400 Å in thickness was sputter deposited onto the trench structure to produce a barrier layer. Copper was then electroplated into the trenches and onto the overlying layer to a thickness 20 percent greater than the depth of the trenches. The copper layer was then removed to the surface of the oxide using chemical/mechanical polishing. Electrical pads were also formed and the pad region was covered with a 1.2 µm thickness of aluminum. The entire structure was passivated by deposition of a 1000 Å thick layer of silicon nitride, followed by a 4000 Å thick oxide layer formed by plasma enhanced chemical vapor deposition from tetraethylorthosilicate followed by another 4000 Å thick layer of silicon nitride. Final annealing was at 350° C. for 30 minutes.

Figure 11:
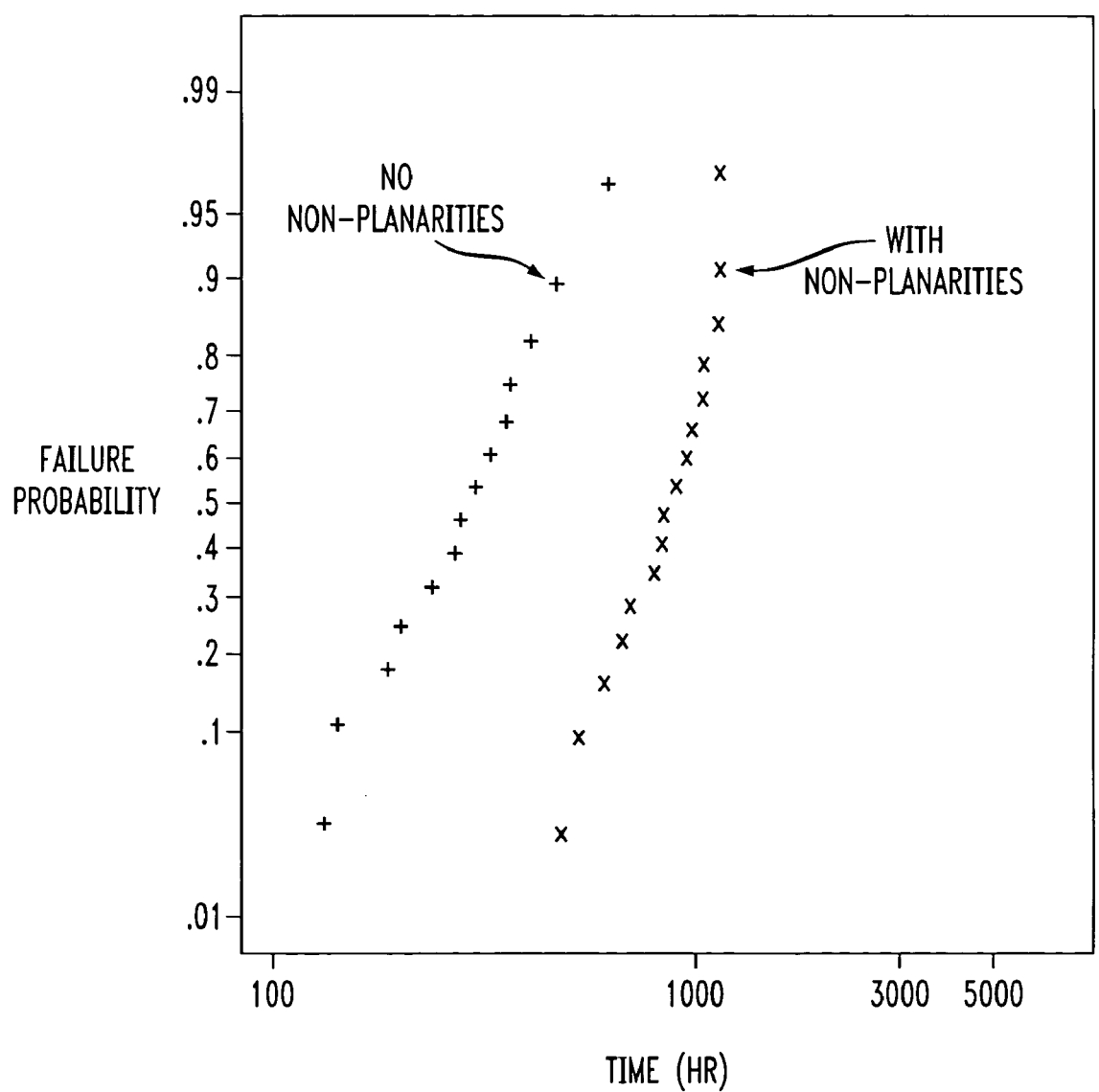

Identical test samples were formed except the trench depth was 0.38 µm and width was 0.28 µm. Additionally, identical test samples were found but without the non-planarities underlying the metal runners. Measurements were taken as described in Example 1 and the results are shown in FIG. 11.

We claim:

1. An electronic device having design rule of 0.9 µm or finer comprising 1) an electrical interconnect configured to electrically connect discrete regions of said electronic device to produce a desired function of said electronic device, said electrical interconnect comprising a patterned metal having two transverse edges and 2) a material underlying said electrical interconnect wherein the surface of said material includes non-planarities having a height of at least 0.02 µm such that at least 80 percent of the distances between nearest neighbors of said non-planarities that are within 0.1 µm of at least one of said transverse edges of said interconnect is about 100 µm or less.

2. The device of claim 1 wherein said metal comprises copper.

3. The device of claim 2 wherein said material comprises tantalum or tantalum nitride.

4. The device of claim 1 wherein said metal comprises aluminum.

5. The device of claim 1 wherein said material comprises titanium nitride or a silicon oxide.

6. The device of claim 1 wherein said metal comprises gold or silver.

7. The device of claim 1 wherein said non-planarities are located within 0.1 µm of both said transverse edges.

8. The device of claim 1 wherein said interconnect comprises a copper runner formed in a trench surrounding said runner.

9. The device of claim 1 wherein said interconnect comprises a copper runner formed in a surrounding trench.

10. An integrated circuit including an electronic device having design rule of 0.9 µm or finer comprising 1) an electrical interconnect configured to electrically connect discrete regions of said integrated circuit to produce a desired function of said integrated circuit, said electrical interconnect comprising a patterned metal having two transverse edges and 2) a material underlying said electrical interconnect wherein the surface of said material includes non-planarities having a height of at least 0.02 µm such that at least 80 percent of the distances between nearest neighbors of said non-planarities that are within 0.1 µm of at least one of said transverse edges of said interconnect is about 100 µm or less.

11. The device of claim 10 wherein said metal comprises copper.

12. The device of claim 11 wherein said material comprises tantalum or tantalum nitride.

13. The device of claim 10 wherein said metal comprises aluminum.

14. The device of claim 10 wherein said metal comprises titanium nitride or a silicon oxide.

15. The device of claim 10 wherein said metal comprises gold or silver.

16. The device of claim 10 wherein said non planarities are located within 0.1 µm of both said transverse edges.

17. The device of claim 10 wherein said interconnect comprises a copper runner formed in a trench surrounding said runner.

18. The device of claim 10 wherein said interconnect comprises an aluminum runner in a device that operates at temperatures of 80° C. or more.

19. A wafer including an electronic device having design rule of 0.9 µm or finer comprising 1) an electrical interconnect configured to electrically connect discrete regions of said electronic device to produce a desired function of said electronic device, said electrical interconnect comprising a patterned metal having two transverse edges and 2) a material underlying said electrical interconnect wherein the surface of said material includes non-planarities having a height of at least 0.02 µm such that at least 80 percent of the distances between nearest neighbors of said non-planarities that are within 0.1 µm of at least one of said transverse edges of said interconnect is about 100 µm or less.

20. The device of claim 19 wherein said metal comprises copper.

21. The device of claim 20 wherein said metal comprises tantalum or tantalum nitride.

22. The device of claim 19 wherein said metal comprises aluminum.

23. The device of claim 19 wherein said material comprises titanium nitride or a silicon oxide.

24. The device of clam 19 wherein said metal comprises gold or silver.

25. The device of claim 19 wherein said non planarities are located within 0.1 µm of both said transverse edges.

26. The device of claim 19 wherein said interconnect comprises a copper runner formed in a trench surrounding said runner.

27. The device of claim 19 wherein said interconnect comprises an aluminum runner in a device that operates at temperatures of 80° C. or more.

* * * * *